(12) United States Patent  
Hiraoka et al.

(10) Patent No.: US 6,740,970 B2
(45) Date of Patent: May 25, 2004

(54) SEMICONDUCTOR DEVICE WITH STACK OF SEMICONDUCTOR CHIPS

(75) Inventors: Tetsuya Hiraoka, Kawasaki (JP); Akira Takashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/973,002

(22) Filed: Oct. 10, 2001

(65) Prior Publication Data

US 2002/0171136 A1 Nov. 21, 2002

(30) Foreign Application Priority Data

May 15, 2001 (JP) ........................................ 2001-145238

(51) Int. Cl.[7] .............................................. H01L 23/48
(52) U.S. Cl. ...................... 257/723; 257/777; 257/707; 257/709; 361/721
(58) Field of Search ................................ 257/685, 686, 257/723, 777, 706, 707, 709; 361/719, 721, 733

(56) References Cited

U.S. PATENT DOCUMENTS

| 5,012,323 | A | * | 4/1991 | Farnworth | 357/75 |
| 5,323,060 | A | * | 6/1994 | Fogal et al. | 257/777 |
| 5,528,083 | A | * | 6/1996 | Malladi et al. | 257/786 |
| 5,721,452 | A | * | 2/1998 | Fogal et al. | 257/685 |
| 5,973,403 | A | * | 10/1999 | Wark | 257/777 |
| 6,005,778 | A | * | 12/1999 | Spielberger et al. | 361/770 |
| 6,198,164 | B1 | * | 3/2001 | Choi | 257/723 |
| 6,252,302 | B1 | * | 6/2001 | Farnworth | 257/723 |
| 6,252,305 | B1 | * | 6/2001 | Lin et al. | 257/777 |
| 6,316,727 | B1 | * | 11/2001 | Liu | 174/52.4 |
| 6,344,683 | B1 | * | 2/2002 | Kim | 257/686 |
| 6,359,340 | B1 | * | 3/2002 | Lin et al. | 257/777 |
| 6,407,456 | B1 | * | 6/2002 | Ball | 257/777 |

FOREIGN PATENT DOCUMENTS

| JP | 5-74991 | 3/1993 |
| JP | 8-130292 | 5/1996 |

* cited by examiner

*Primary Examiner*—Carl Whitehead, Jr.
*Assistant Examiner*—L. Cruz
(74) *Attorney, Agent, or Firm*—Armstrong, Kratz, Quintos, Hanson & Brooks, LLP

(57) ABSTRACT

A semiconductor device is configured of a first semiconductor chip mounted on a substrate, a plate member arranged on the first semiconductor chip, and a second semiconductor chip arranged on the plate member. Bonding wires electrically connect the pads of the first semiconductor chip and the pads of the second semiconductor chip to the pads of the substrate, and a sealing resin seals the first semiconductor chip and the second semiconductor chip. A first portion of the plate member is displaced away from the ends of the first and second semiconductor chips, and a second portion of the plate member extending perpendicular to the first portion, projects outward from the first and second semiconductor chips to be exposed to the outside.

4 Claims, 2 Drawing Sheets

SEMICONDUCTOR DEVICE WITH STACK OF SEMICONDUCTOR CHIPS

BACKGROUND OF THE INVENTION

1. Field of the Invention

The present invention relates to a semiconductor device having a plurality of semiconductor chips incorporated in a single semiconductor package.

2. Description of the Related Art

Demand for smaller sized semiconductor devices, and for smaller sized electronic apparatuses including the semiconductor device, is growing steadily. A conventional semiconductor device is formed by mounting a semiconductor chip on a lead frame and sealing the semiconductor chip with resin. An electronic apparatus includes a motherboard on which a plurality of semiconductor devices are mounted by leads. The size of the electronic apparatus becomes larger as number of semiconductor devices mounted on the motherboard increases.

In recent years, a semiconductor device having a CSP (chip size package) structure has been developed. In the CSP structure, a semiconductor chip is mounted on a substrate called an interposer, the pads of the semiconductor chip are electrically connected to the circuit of the interposer by wires or balls, and the semiconductor chip is sealed with resin. Balls constituting external terminals are arranged on the lower surface of the interposer, and the semiconductor device is mounted on the motherboard by coupling the balls to the motherboard.

The semiconductor device having a CSP structure can be formed in a very small size and therefore the electronic apparatus can also be formed in a very small size. Further, a semiconductor device, using an MCM (multichip module) structure and with a plurality of semiconductor chips arranged in a single package, has been developed and this can reduce the size of the electronic apparatus even more. In a semiconductor device having an MCM structure, the pads of several semiconductor chips are electrically connected to the circuit of the substrate called the interposer by wires or balls, and the balls constituting external terminals arranged on the lower surface of the interposer are connected to the motherboard. In this way, the number of elements mounted on the motherboard can be reduced, and therefore the size of the electronic apparatus can be further reduced.

Also, the semiconductor device generates heat, and it is required to dissipate this heat. Japanese Unexamined Patent Publication (Kokai) No. 5-74991 discloses a semiconductor device comprising a heat radiation lead arranged in the package of the semiconductor device and extended outside the package. Japanese Unexamined Patent Publication (Kokai) No. 8-130292 discloses a stack structure of semiconductor devices comprising a plurality of semiconductor devices put one on another in a stack, and electric connectors arranged on either side of the stack of the semiconductor devices, leads extending from the ends of each semiconductor device to the electric connectors on the two sides, and a heat radiation plate arranged between adjacent two semiconductor devices to improve the heat radiation characteristic of the stack structure of the semiconductor devices.

An MCM structure of semiconductor devices can be classified into a structure in which a plurality of semiconductor devices are arranged in parallel to the surface of a substrate, and a stack structure in which a plurality of semiconductor devices are stacked vertically on the substrate. With the stack structure, in spite of the presence of a plurality of semiconductor chips, the size of the semiconductor device (as viewed from above the semiconductor device) can be reduced to a size substantially equal to a size of a semiconductor device containing a single semiconductor chip.

However, in a semiconductor device having a stack structure such as, for example, a semiconductor device having two semiconductor chips stacked vertically, it is necessary to arrange that a first semiconductor chip is mounted on an interposer, and after electrically connecting the pads of the first chip to the pads of the interposer, the second chip is mounted on the first semiconductor chip, and then the pads of the second semiconductor are electrically connected to the circuit of the interposer.

For electrical connection of the pads, bumps (solder, gold, etc.) or bonding wires are used. The connection by bumps, however, poses not only the problem of an increased processes for bump fabrication and reliability in the jointed portions, but also the problem that it difficult to connect the pads of the second semiconductor to the circuit of the interposer, since the first semiconductor chip exists between the second semiconductor chip and the interposer.

The connection by wire bonding is free of the problems described above and has the advantage that the structure can be obtained comparatively easily and assuredly. Nevertheless, the problem of wire bonding is that it is not applicable to the case in which the first semiconductor chip and the second semiconductor chip have the same size. If, for example, a first semiconductor chip is mounted on the interposer, and the pads of the first chip is electrically connected to the interposer by wire bonding, after which a second chip is mounted on the first semiconductor chip, the second chip cannot be mounted snugly on the first semiconductor chip because the pads of the first chip are bonded by wires.

Further, some types of semiconductor chips accommodated in the semiconductor device operate at high frequencies and with a high output, and such a semiconductor device generates a considerable amount of heat in operation. Therefore, improved heat removal, for the operating semiconductor device, is also required.

SUMMARY OF THE INVENTION

An object of the present invention is to provide a semiconductor device, comprising a plurality of semiconductor chips accommodated in a single package in a stack, without increasing the size of the package and in which the semiconductor chips can be easily electrically connected within the package.

Another object of the invention is to provide a semiconductor device comprising a plurality of semiconductor chips accommodated in a single package and having an improved heat removal characteristic.

According to the present invention, there is provided a semiconductor device comprising; a substrate having pads, a first semiconductor chip mounted on the substrate and having pads, a plate member arranged on the first semiconductor chip and having an end at an inward position of the first semiconductor chip from the pads, a second semiconductor chip arranged on said plate member and having pads, a structure electrically connecting the pads of the first semiconductor chip and the pads of the second semiconductor chip to the pads of the substrate, and a seal member sealing the first semiconductor chip and the second semiconductor chip. The plate member can be a metal plate or a substrate having a circuit.

In the configuration described above, the. plate member having the end located inward of the first semiconductor chip from the pads is arranged on the first semiconductor chip, and the second semiconductor chip is arranged on the plate member. The second semiconductor chip can be arranged, in alignment with the first semiconductor chip, over the first semiconductor chip. The plate member is interposed between the first semiconductor chip and the second semiconductor chip at a position behind the ends of the first semiconductor chip and the second semiconductor chip. Even in the case where the pads of the first semiconductor chip are bonded by wires to the pads of the substrate (interposer), therefore, the second semiconductor chip can be arranged over the first semiconductor chip without interfering with the bonding wires. After the second semiconductor chip is arranged on the plate member, the pads of the second semiconductor chip can be connected to the circuit by wire bonding.

Preferably, the sides of the plate member are exposed to the outside from the surface of the seal member. By doing so, the heat generated in the semiconductor device is removed from the semiconductor device through the plate member. In the case where the plate member is configured of a stack of layers, moisture in the semiconductor device is released out of the semiconductor device through a gap between the plurality of the layers. As a result, a malfunction of the semiconductor device which otherwise might be caused by the water which may stay and evaporate in the semiconductor device and expand the seal member, is prevented.

Preferably, the plate member includes pads, and the structure electrically connecting the pads of the first semiconductor chip and the pads of the second semiconductor chip includes members electrically connecting at least one of the pads of the first semiconductor chip and the pads of the second semiconductor chip to the pads of the plate member and members for electrically connecting the pads of the plate member to the circuit of the substrate. For example, the pads of the second semiconductor chip are connected to the circuit of the substrate through the circuit of the plate member. By doing so, the points of electric connection can be rearranged.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
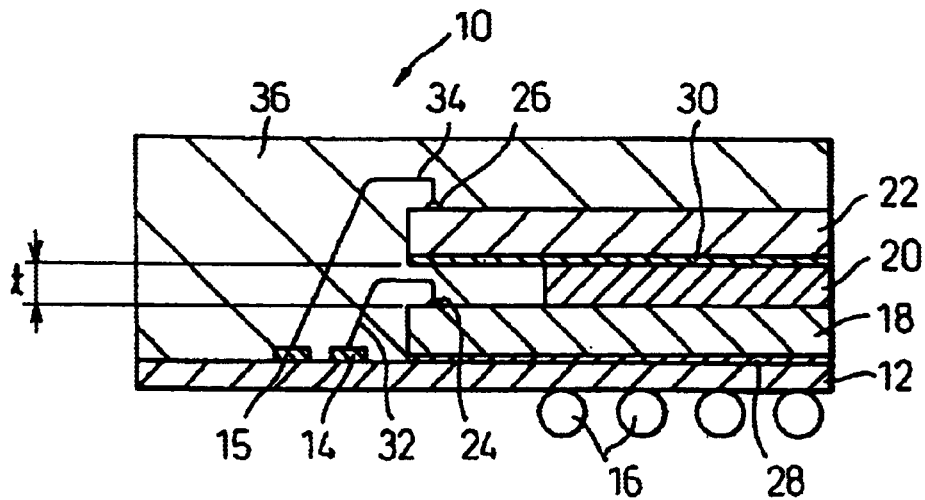
FIG. 1 is a cross-sectional view showing a semiconductor device according to a first embodiment of the present invention.
Figure 2:
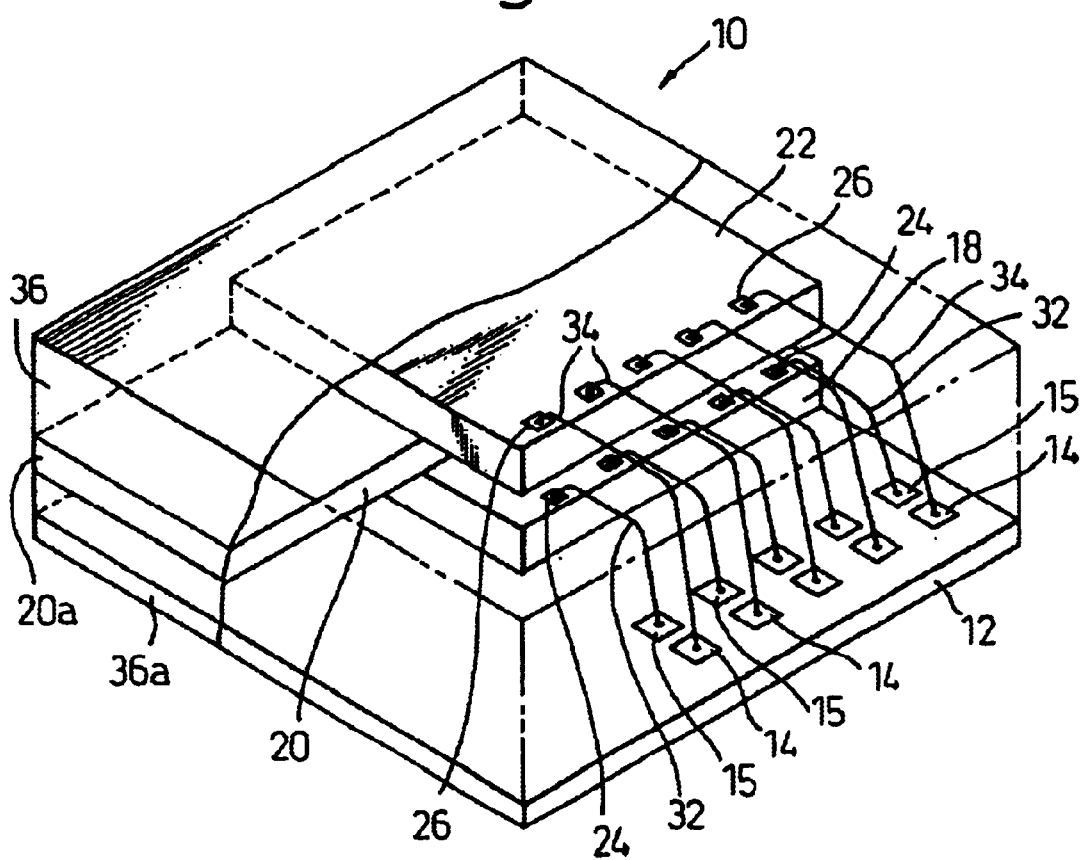
FIG. 2 is a partly cut away perspective view showing the semiconductor device of FIG. 1.

Embodiments of the present invention will be explained below with reference to the drawings. FIG. 1 is a cross-sectional view showing a semiconductor device 10 according to a first embodiment of the invention. FIG. 2 is a partly cut away perspective view showing the semiconductor device 10 of FIG. 1.

The semiconductor device 10 includes a substrate (interposer) 12. The substrate 12 has pads 14 and 15 and balls 16 constituting external terminals. The substrate 12 includes a circuit not shown, and the balls 16 are connected to the pads 14 and 15 via the circuit. The balls 16 are gold or solder bumps.

The semiconductor device 10 comprises a first semiconductor chip 18 mounted on the substrate 12, a plate member 20 arranged on the first semiconductor chip 18, and a second semiconductor chip 22 arranged on the plate member 20. The size of the first semiconductor chip 18 is equal to that of the second semiconductor chip 22, and the second semiconductor chip 22 is arranged above, and in alignment with, the first semiconductor chip 18.

The first semiconductor chip 18 has a circuit not shown and pads 24 connected to that circuit. The pads 24 are arranged along at least one side of the first semiconductor chip 18. The second semiconductor chip 22 has a circuit not shown and pads 26 connected to the circuit. The pads 26 are arranged along at least one side of the second semiconductor chip 22.

The plate member 20 is formed of a metal plate of copper, for example. Alternatively, the plate member 20 may be an insulating plate. The plate member 20 formed of an insulating plate may be composed of, for example, a plurality of layers to make up a glass epoxy substrate and may include a metal layer between each pair of adjacent layers. Thus, the plate member 20 has a superior heat conductivity. The plate member 20 is arranged on the first semiconductor chip 18, and has an end at a position on the first semiconductor chip 18 away from the pads 24. In other words, the plate member 29 is arranged at a distance away from the end of the first semiconductor chip 18 corresponding to the length of the bonding wire described later.

The first semiconductor chip 18 is fixed to the substrate 12 by a die bonding material 28. The plate member 20 is attached to the first semiconductor chip 18 by an adhesive. The second semiconductor chip 22 is fixed to the plate member 20 by a die bonding material 30.

The pads 24 of the first semiconductor chip 18 are connected to the pads 14 of the substrate 12 by bonding wires 32, and the pads 26 of the second semiconductor chip 22 are connected to the pads 15 of the substrate 12 by bonding wires 34. In this way, the pads 24 of the first semiconductor chip 18 and the pads 26 of the second semiconductor chip 22 are electrically connected to the pads 14 and 15 of the substrate 12. Also, a sealing resin 36 seals the first semiconductor chip 18 and the second semiconductor chip 22.

The semiconductor device is assembled in the following steps. The first semiconductor chip 18 is mounted on the substrate 12, and the pads 24 of the first semiconductor chip 18 are connected to the pads 14 of the substrate 12 by the bonding wires 32. Then, the plate member 20 is mounted on the first semiconductor chip 18, the second semiconductor chip 22 is mounted on the plate member 20, and the pads 26 of the second semiconductor chip 22 are connected to the pads 15 of the substrate 12 by the bonding wires 34.

The plate member 20 has an end at a position on the first semiconductor chip 18 away from the pads 24. In other words, the plate member 20 is arranged between the first semiconductor chip 18 and the second semiconductor chip 22 and at a position away from the ends of the first semiconductor chip 18 and the second semiconductor chip 22. As a result, even in the case where the pads 24 of the first semiconductor chip 18 are connected to the pads 14 of the substrate 12 by the bonding wires 32, the second semiconductor chip 22 can be arranged above the first semiconductor chip 18 without interfering with the bonding wires 32.

The height of the bonding wires 32 extending above the surface of the first semiconductor chip 18 is very small and, accordingly, the thickness of the plate member 20 (i.e. the gap between the first semiconductor chip 18 and the second semiconductor chip 22) is about 100 to 150 $\mu$m. The die bonding material 30 in the form of sheet bonded to the lower surface of the second semiconductor chip 22 is an insulator, and therefore the bonding wires 32 can be in contact with the die bonding material 30 on the lower surface of the second semiconductor chip 22 without posing any problem. Also, the die bonding material 30 functions as a cushion and prevents the wires from being extremely deformed.

The pads 14 and 15 of the substrate 12, the pads 24 of the first semiconductor chip 18 and the pads 26 of the second semiconductor chip 22 are arranged only on one side of the first and second rectangular semiconductor chips 18 and 22. However, the pads 14, 15, 24 and 26 may be arranged on a plurality of sides of the first and second rectangular semiconductor chips 18 and 22. In any case, the circuit of the substrate 12 and the balls 16 can be arranged substantially uniformly over the lower surface of the substrate in spite of the one-sided arrangement of the pads 14, 15, 24 and 26.

Further, the plate member 20 is kept away from the side surfaces of the first and second semiconductor chips 18 and 22 where the pads 24 and 26 are arranged, as described above, but the plate member 20 extends outward of the side surfaces of the first and second semiconductor chips 18 and 22 where no pads 24 and 26 are arranged, and is exposed, to the outside, from the surface 36a of the sealing resin 36. In other words, the side surface 20a of the plate member 20 is located flush with the surface 36a of the sealing resin 36. In the embodiment, the semiconductor device 10 is formed by cutting with a dicer and is packaged as an individual product. The side surface 20a of the plate member 20 and the surface 36a of the sealing resin 36 are formed, as a result, as a flat cut surface.

Therefore, heat generated in the semiconductor device 10 is moved out of the semiconductor device 10 through the plate member 20, since the side surface 20a of the plate member 20 is exposed, to the outside, from the surface 36a of the sealing resin 36. Thus, the proper operation of the semiconductor device 10 is guaranteed.

Figure 3:
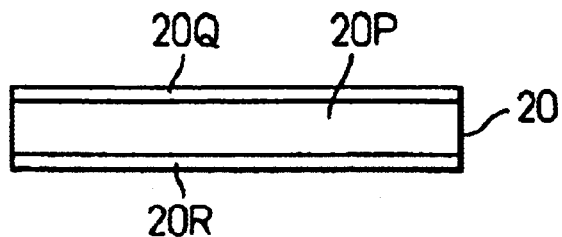
FIG. 3 is a view showing an example of the plate member configured of a plurality of layers.

Further, as shown in FIG. 3, the plate member 20 is preferably configured of a plurality of laminated layers 20P, 20Q and 20R. In the case where the plate member 20 is made of metal, for example, the central layer 20P is made of a copper plate while the upper and lower layers 20Q and 20R are formed of thin gold films. In the case where the plate member 20 is formed of a glass epoxy substrate, on the other hand, the central layer 20P is formed of a glass epoxy substrate while the upper and lower layers 20Q and 20R are formed of thin gold films. As another alternative, the thin gold film may be replaced by a thin copper film plated with nickel and gold. In any case, the plate member 20 is not necessarily configured to include the three layers 20P, 20Q and 20R but may include two layers. Also, the upper and lower layers 20Q and 20R are not required to cover the whole surface of the central layer 20P but may cover a part of the central layer 20P.

In the case where the plate member 20 is configured of a plurality of laminated layers 20P, 20Q and 20R, water in the semiconductor device 10 is released from between the plurality of the layers 20P, 20Q and 20R. As the bonding force is low in the interface between two layers, water easily flows out through the interface at between two layers. As a result, it is possible to prevent the water remains and is evaporated within the semiconductor device 10, causing the sealing resin 36 to expand and causing a malfunction of the semiconductor device.

Figure 4:
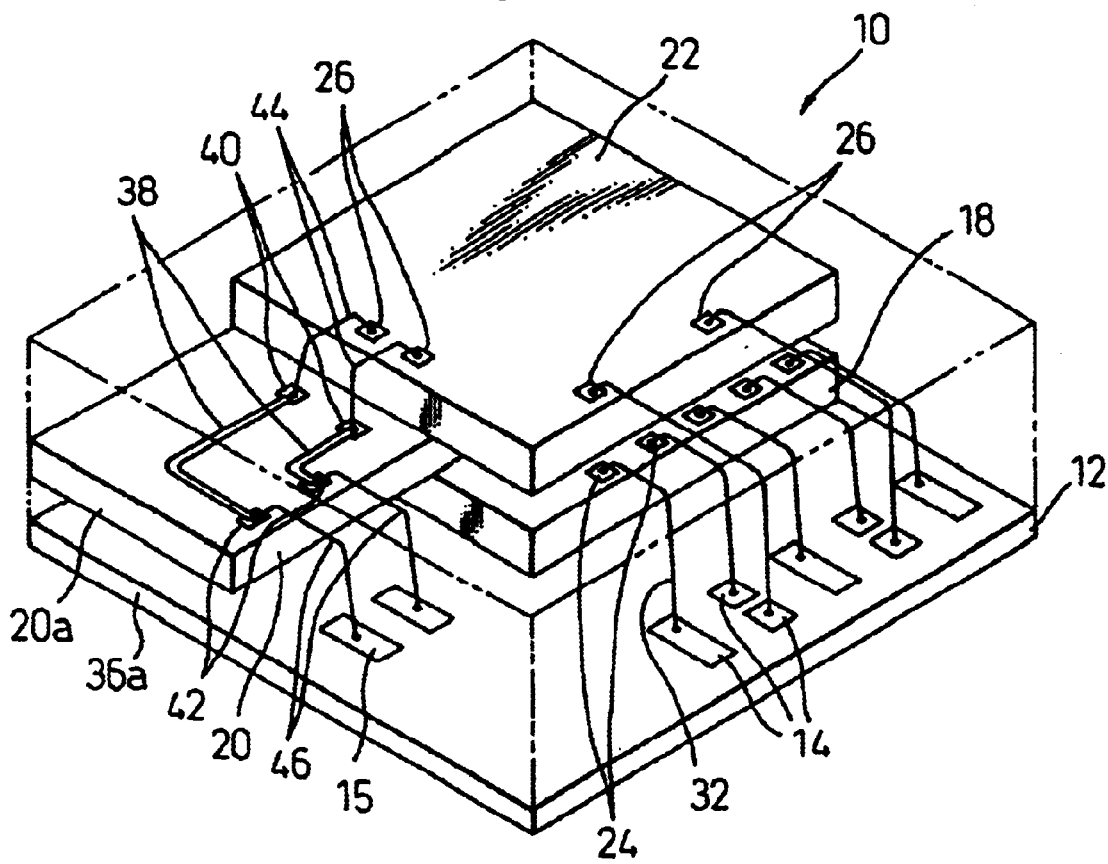
FIG. 4 is a partly cut away perspective view showing a semiconductor device according to a second embodiment of the present invention.

FIG. 4 is a partly cutaway perspective view of the semiconductor device 10 according to a second embodiment of the invention. As in the first embodiment, the semiconductor device 10 comprises a substrate (interposer) 12, a first semiconductor chip 18 mounted on the substrate 12, a plate member 20 arranged on the first semiconductor chip 18 and a second semiconductor chip 22 arranged on the plate member 20. The size of the first semiconductor chip 18 is equal to that of the second semiconductor chip 22, and the second semiconductor chip 22 is arranged in alignment with the first semiconductor chip 18 and above the first semiconductor chip 18.

The substrate 12 includes an internal circuit, pads 14 and 15 and balls making up external terminals. The first semiconductor chip 18 has a circuit, not shown, and pads 24 connected to the circuit. The pads 24 are arranged along at least one side of the first semiconductor chip 18. The second semiconductor chip 22, on the other hand, has a circuit, not shown, and pads 26 connected to the circuit. The pads 26 are arranged along two sides of the second semiconductor chip 22.

The plate member 20 comprises a glass epoxy substrate, for example, and includes, on the surface thereof, a patterned circuit 38 and pads 40 and 42 arranged at the ends of the circuit 38. The plate member 20 is arranged on the first semiconductor chip 18, and has an end at an inward position of the first semiconductor chip 18 from the pads 24. The sealing resin 36 seals the first semiconductor chip 18 and the second semiconductor chip 22.

The pads 24 of the first semiconductor chip 18 are connected to the pads 14 of the substrate 12 by bonding wires 32. The pads 26 on one side of the second semiconductor chip 22 are connected to the pads 15 of the substrate 12 by bonding wires 34. The pads 26 on another side of the second semiconductor chip 22 are connected to the pads 40 of the plate member 20 by bonding wires 44. Further, the pads 42 of the plate member 20 are connected to the pads 15 of the substrate 12 by the bonding wires 44. In this way, the pads 24 of the first semiconductor chip 18 and the pads 26 of the second semiconductor chip 22 are electrically connected to the pads 14 and 15 of the substrate 12.

In this embodiment too, the plate member 20 has an end at a position on the first semiconductor chip 18 away from the pads 24. Even in the case where the pads 24 of the first semiconductor chip 18 are connected to the pads 14 of the substrate 12 by the bonding wires 32, therefore, the second semiconductor chip 22 can be arranged above the first semiconductor chip 22 without interfering with the bonding wires 32. The thickness of the plate member 20 (i.e. the gap between the first semiconductor chip 18 and the semiconductor chip 22) is about 100 to 150 $\mu$m.

In this way, the balls 16 of the substrate 12 can be arranged substantially uniformly over the lower surface of the substrate 12 in spite of the one-sided arrangement of the pads 14, 15, 24 and 26. Also, the plate member 22 including the circuit 38 and the pads 40 and 42 allows rearrangement of the pads and balls.

Further, the side surface 20a of the plate member 20 is exposed, to the outside, from the surface 36a of the sealing resin 36, and therefore heat generated in the semiconductor device 10 is moved out of the semiconductor device 10 through the plate member 20. As a result, the proper operation of the semiconductor 10 is guaranteed. Also, the plate member 20 is preferably configured of a plurality of laminated layers. In this case, the plate member 20 is formed of a glass epoxy substrate and a conductive layer including the circuit 38 and the pads 40 and 42. This conductive layer covers the surface of the glass epoxy substrate except for the circuit 38 and the pads 40 and 42. The conductive layer may be formed of a thin copper film plated with nickel and gold.

As described above, the plate member 20 makes possible the wire bonding of a plurality of the semiconductor chips 18 and 22 arranged in a stack. At the same time, the plate member 20 permits the semiconductor device 10 to be cooled and the water in the semiconductor device to be discharged.

As described above, according to the present invention, a plurality of semiconductor chips are accommodated in a stack in a single package, and a plate member is arranged between adjacent semiconductor chips. Therefore, a semiconductor device is provided in which the semiconductor chips can be easily electrically connected within the package without increasing the size of the package. Also, heat is removed through the plate member, and therefore a semiconductor with an improved cooling characteristic is obtained. Further, by designing the plate member to be large and cutting off the plate member with the sealing member at the time of dicing the semiconductor device, the side surface of the plate member is exposed, to the outside, from the surface of the sealing member for an improved heat loss characteristic, while at the same time forming a water discharge path thereby to prevent the internal pressure of the semiconductor device from rising abnormally.

What is claimed is:

1. A semiconductor device comprising:
   a substrate having a first plurality of pads and a second plurality of pads;
   a first semiconductor chip mounted on said substrate and having a third plurality of pads;
   a plate member arranged on said first semiconductor chip and having an end at an inward position of said first semiconductor chip adjacent to the third plurality of pads;
   a second semiconductor chip arranged on said plate member and having a fourth plurality of pads;
   a first structure and a second structure respectively and electrically interconnecting said third plurality of pads with said first plurality of pads and said fourth plurality of pads with said second plurality of pads; and
   a seal member sealing said first semiconductor chip, said plate member and said second semiconductor chip and having a seal member side surface;
   wherein said plate member has a first portion covered by said first and second semiconductor chips, and a second portion protruding from said fist and second semiconductor chips and extending through said seal member to the seal member side surface whereby said plate member is exposed to an outside of said seal member.

2. A semiconductor device according to claim 1, wherein said first structure and said second structure are made of bonding wires.

3. A semiconductor device according to claim 1, wherein said plate member comprises a plurality of laminated layers.

4. A semiconductor device according to claim 1, wherein said plate member includes a fifth plurality of pads, part of said second structure electrically inter-connecting part of said fourth plurality of pads with part of said second plurality of pads via said fifth plurality of pads.

* * * * *